(12) United States Patent
Mermagen et al.

(10) Patent No.: US 8,532,315 B2
(45) Date of Patent: Sep. 10, 2013

(54) HIGH POWERED HIGH SPEED SWITCH

(75) Inventors: Timothy J. Mermagen, Havre de Grace, MD (US); Larry G. Ferguson, Baltimore, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 914 days.

(21) Appl. No.: 12/417,027

(22) Filed: Apr. 2, 2009

(65) Prior Publication Data

US 2010/0253415 A1  Oct. 7, 2010

(51) Int. Cl.
*H02B 1/00* (2006.01)

(52) U.S. Cl.
USPC .......................................... 381/123; 381/120

(58) Field of Classification Search
USPC ......................................................... 381/123
See application file for complete search history.

(56) References Cited

U.S. PATENT DOCUMENTS

| | | | |
|---|---|---|---|
| 4,196,314 A | 4/1980 | Guillory | |
| 5,526,434 A | 6/1996 | Wakui | |
| 5,714,809 A | 2/1998 | Clemo | |
| 5,751,818 A | 5/1998 | Gertz et al. | |
| 6,051,895 A * | 4/2000 | Mercier | 307/125 |
| 2003/0063755 A1 | 4/2003 | Nourse et al. | |
| 2006/0049458 A1 * | 3/2006 | Kim | 257/341 |
| 2006/0159292 A1 * | 7/2006 | Guilbert | 381/120 |
| 2007/0082611 A1 * | 4/2007 | Terranova et al. | 455/41.1 |
| 2007/0142728 A1 * | 6/2007 | Penner et al. | 600/486 |
| 2007/0215939 A1 * | 9/2007 | Xu et al. | 257/336 |
| 2009/0235006 A1 * | 9/2009 | Desrosiers et al. | 710/304 |
| 2010/0232623 A1 * | 9/2010 | Martin et al. | 381/96 |

* cited by examiner

*Primary Examiner* — Robert J Hoffberg
*Assistant Examiner* — Igwe U Anya
(74) *Attorney, Agent, or Firm* — Alan I. Kalb

(57) ABSTRACT

An amplified signal switching system comprises a plurality of transducers, and a switch operable for diverting amplified transient signals to selected transducers and preventing the amplified transient signals from being sent to non-selected transducers, wherein the amplified transient signals are AC or acoustic signals, wherein the plurality of transducers comprise a plurality of speakers, and wherein the plurality of transducers are isolated from one another. The switching system further comprises an amplifier operable for sending the amplified transient signals to the switch. The switch selectively turns the amplified transient signals on and off to the selected transducers in order to prevent the non-selected transducers from receiving the amplified transient signals. Moreover, the switch minimizes signal distortion in the selected transducers, and alternatively, the switch eliminates signal output to the non-selected transducers.

3 Claims, 3 Drawing Sheets

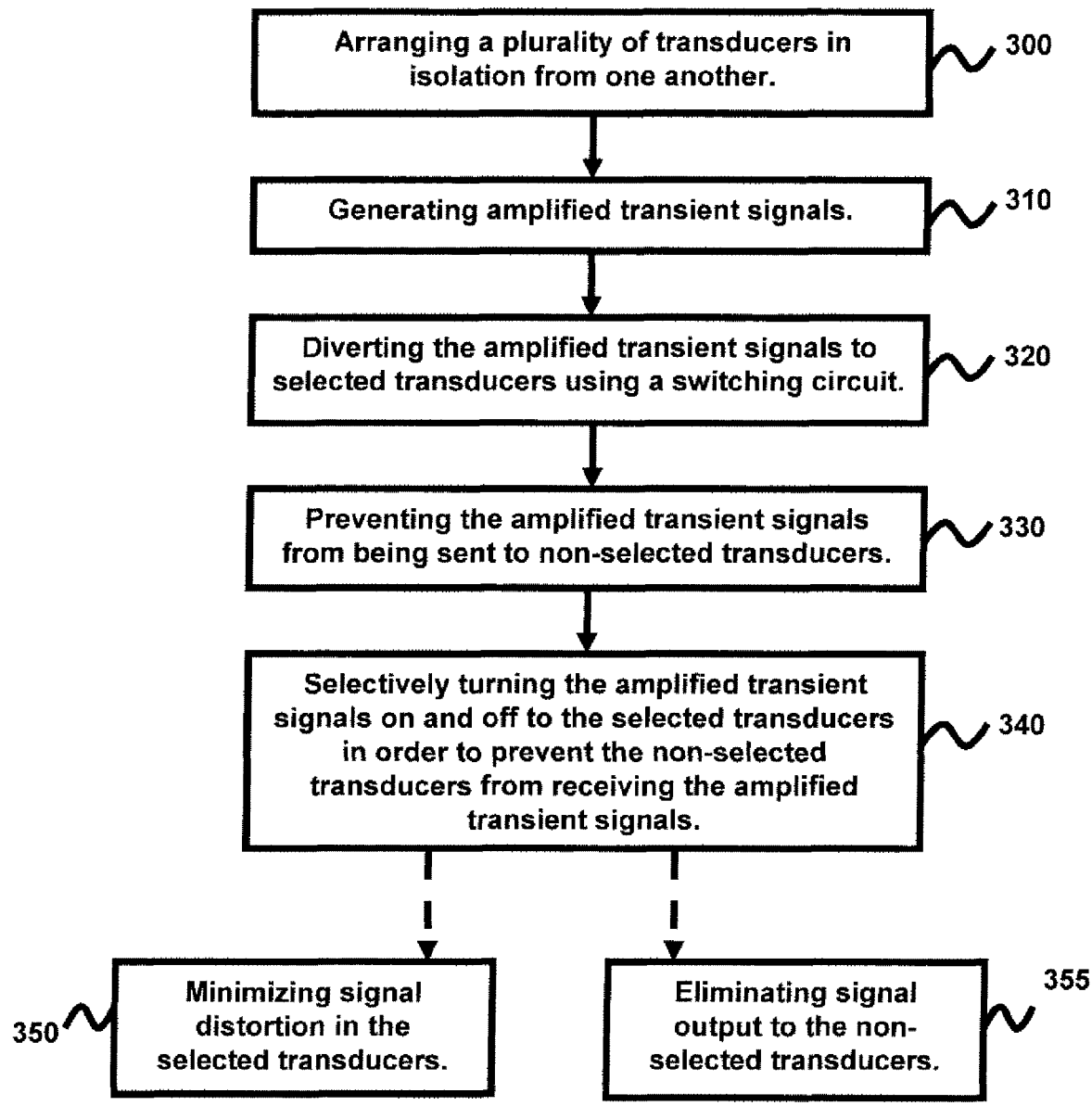

ND SPEED SWITCH

GOVERNMENT INTEREST

The embodiments of the invention described herein may be manufactured, used, and/or licensed by or for the United States Government without the payments of royalties thereon.

BACKGROUND

1. Field of the Invention

The embodiments herein generally relate to the field of electrical circuitry, and more particularly to a circuit capable of switching an amplified AC signal to any one of several transducers.

2. Description of the Related Art

Military personnel are often trained using hostile environment simulators. An example of such as simulator is an array of strategically spaced targets representing hostile fire or the enemy, etc. In order to best create a battlefield scenario sound systems are employed in such simulators to recreate battlefield noises in order to train military personnel. Conventionally, this sound system has included speakers arranged in various locations, some of which are isolated from one another due to the wide-spaced layout of the simulators. As such, each speaker is required to be powered by its own amplifier. This is because conventional switches cannot handle powered AC signals, therefore the signal would have to be amplified at each individual speaker. Such a setup is not only unduly expensive, but also requires significant resources for maintenance of each speaker/amplifier unit. Moreover, it has been virtually impossible to design a system, which can easily turn on or off a particular speaker so that there is no sound distortion emanating from the other speakers in the simulator. Recent simulator designs have required the capability of switching moderately powered AC signals.

A HEXFET®, available from International Rectifier, California, USA, is capable of handling higher currents and voltages better than a standard FET. To date, most of the hexagonal cell field effect transistors (HEXFET) applications for switching and power handling capabilities are involved with motor controls. Motor controls are DC power applications that are easily handled by power HEXFETs and require no special or unique circuitry. Conventionally, voltage is applied to the gate of the HEXFET, which turns the HEXFET on, supplying DC power to the motor. Switching of powered AC signals presents quit a different and more difficult problem. With an AC signal placed on the drain of the HEXFET, the HEXFET can be turned on inadvertently depending on the polarity and magnitude of the powered AC signal. For example if +5 volts is required to turn on a p-channel HEXFET and the gate has 0 volts applied to it, if the AC signal on the drain transitions to −5 volts, then the relative gate-drain voltage will be +5 volts and the HEXFET will turn on. This may not be a desirable effect in instances when it is not required for the HEXFET to be turned on, but does so nonetheless. Moreover, for control of a powered AC signal where complete isolation and total mitigation of the signal is required this is an undesirable effect.

Currently, there are no available systems that are capable of switching on/off high-powered acoustic signals. Most conventional switches are designed for DC TTL (transistor-transistor logic) level signals only. Moreover, most switches capable of handling power are for motor control only. As such, these conventional switches are not designed to handle AC or transient signals above 60 Hz.

Therefore, due to the limitations of conventional switching circuits there is a need for a switching circuit, which includes mitigation capabilities to handle voltage transients that could inadvertently turn a HEXFET on. Furthermore, there is a need for a circuit, which can accommodate high powered and high-speed AC signals.

SUMMARY

In view of the foregoing, an embodiment herein provides an amplified signal switching system comprising a plurality of transducers and switch operable for diverting amplified transient signals to selected transducers and preventing the amplified transient signals from being sent to non-selected transducers, wherein the amplified transient signals are AC or acoustic signals, wherein the plurality of transducers comprise a plurality of speakers, and wherein the plurality of transducers are isolated from one another. The system further comprises an amplifier operable for sending the amplified transient signals to the switch. The switch selectively turns the amplified transient signals on and off to the selected transducers in order to prevent the non-selected transducers from receiving the amplified transient signals. Moreover, the switch minimizes signal distortion in the selected transducers, and alternatively, the switch eliminates signal output to the non-selected transducers.

The system further comprises an n-channel hexagonal cell field effect transistor comprising an n-channel source, an n-channel drain, and an n-channel gate component, wherein the n-channel hexagonal cell field effect transistor is connected to the switch; a p-channel hexagonal cell field effect transistor comprising a p-channel source, a p-channel drain, and a p-channel gate component, wherein the p-channel hexagonal cell field effect transistor is connected to the switch; and a voltage input unit operable to send voltage to the n-channel gate component and the p-channel gate component, wherein the amplifier is operable for sending the amplified transient signals to the p-channel drain component, and wherein the p-channel source component is connected in series to the n-channel drain component through the transducers.

Another embodiment provides a method of diverting amplified transient signals comprising arranging a plurality of transducers in isolation from one another, generating amplified transient signals, diverting the amplified transient signals to selected transducers using a switching circuit, and preventing the amplified transient signals from being sent to non-selected transducers, wherein the amplified transient signals are AC or acoustic signals, and wherein the plurality of transducers comprise a plurality of speakers. The method further comprises selectively turning the amplified transient signals on and off to the selected transducers in order to prevent the non-selected transducers from receiving the amplified transient signals. Moreover, the method further comprises minimizing signal distortion in the selected transducers, or alternatively eliminating signal output to the non-selected transducers.

An advantage of the system is that one can amplify the signal before being switched to a speaker. This means only one amplifier is needed for all of the speakers as opposed to amplifying the signal directly to the speaker, which would require separate amplifiers for each speaker. Also, the system can handle rapidly changing AC signals with complete isolation from adjacent channels and speakers. Moreover, the system can easily switch moderately powered AC signals (signals in excess of 10 V). In fact, experimental tests have been performed on the system with voltages in excess of 100 V on an 8-Ohm load, and the system functioned properly according to the experiment. According to the embodiments herein, the unique design for switching AC signals can easily handle high frequency signals (50 KHz) with moderately high power (in excess of 500 watts) and complete isolation for adjacent channels and speakers. The design of the system also eliminates the inherent "pop" associated with conventional amplifier turn on. Furthermore, the switch is capable of diverting an amplified transient signal to any one of several transducers thus eliminating the need to adjust for output impedance concerns. The circuit also completely isolates the transducers from each other thus eliminating cross talk between transducers or concerns associated with AC signals on ground planes.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 3 is a flow diagram illustrating a preferred method of an embodiment herein.

DETAILED DESCRIPTION OF PREFERRED EMBODIMENTS

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

Figure 1:
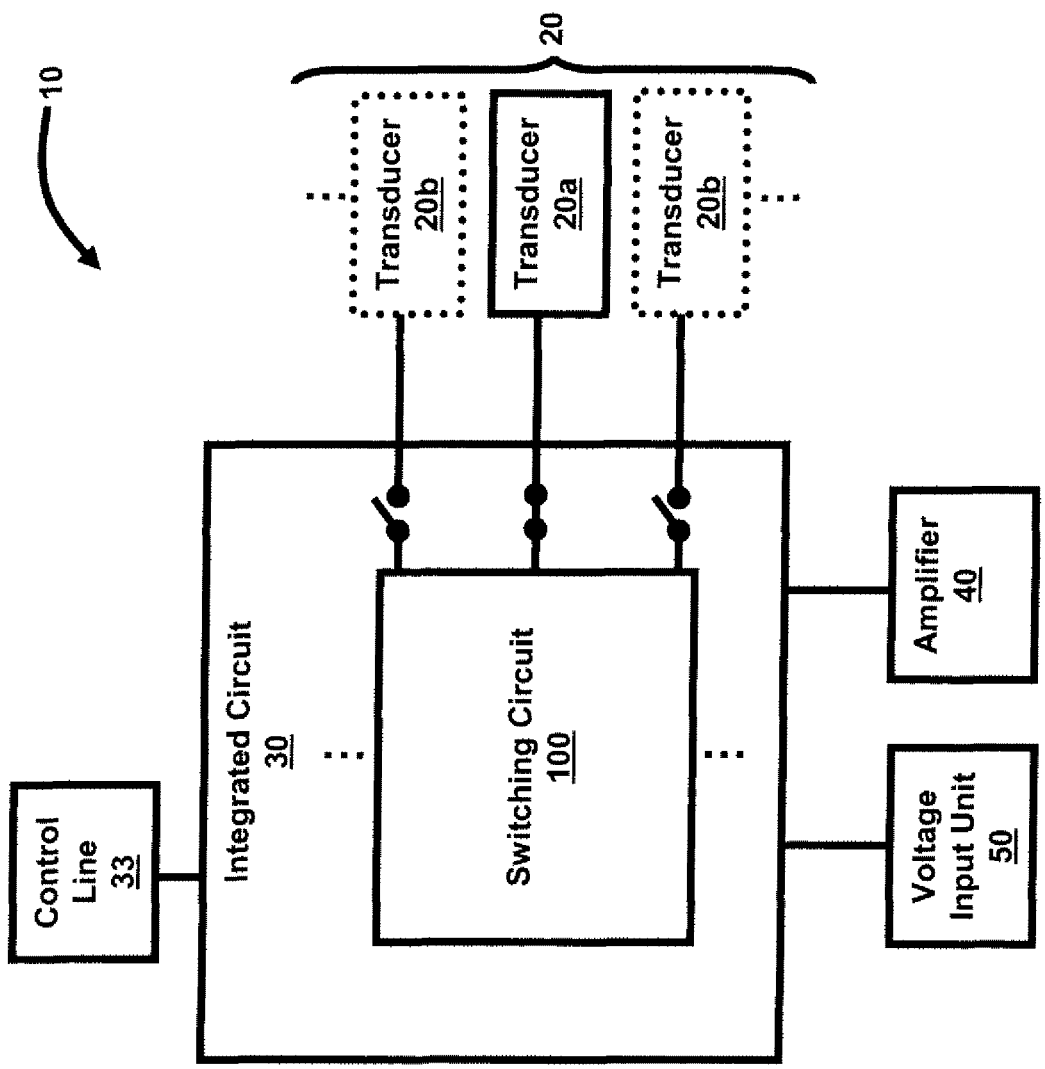
FIG. 1 is a block diagram of a system according to an embodiment herein.
Figure 2:
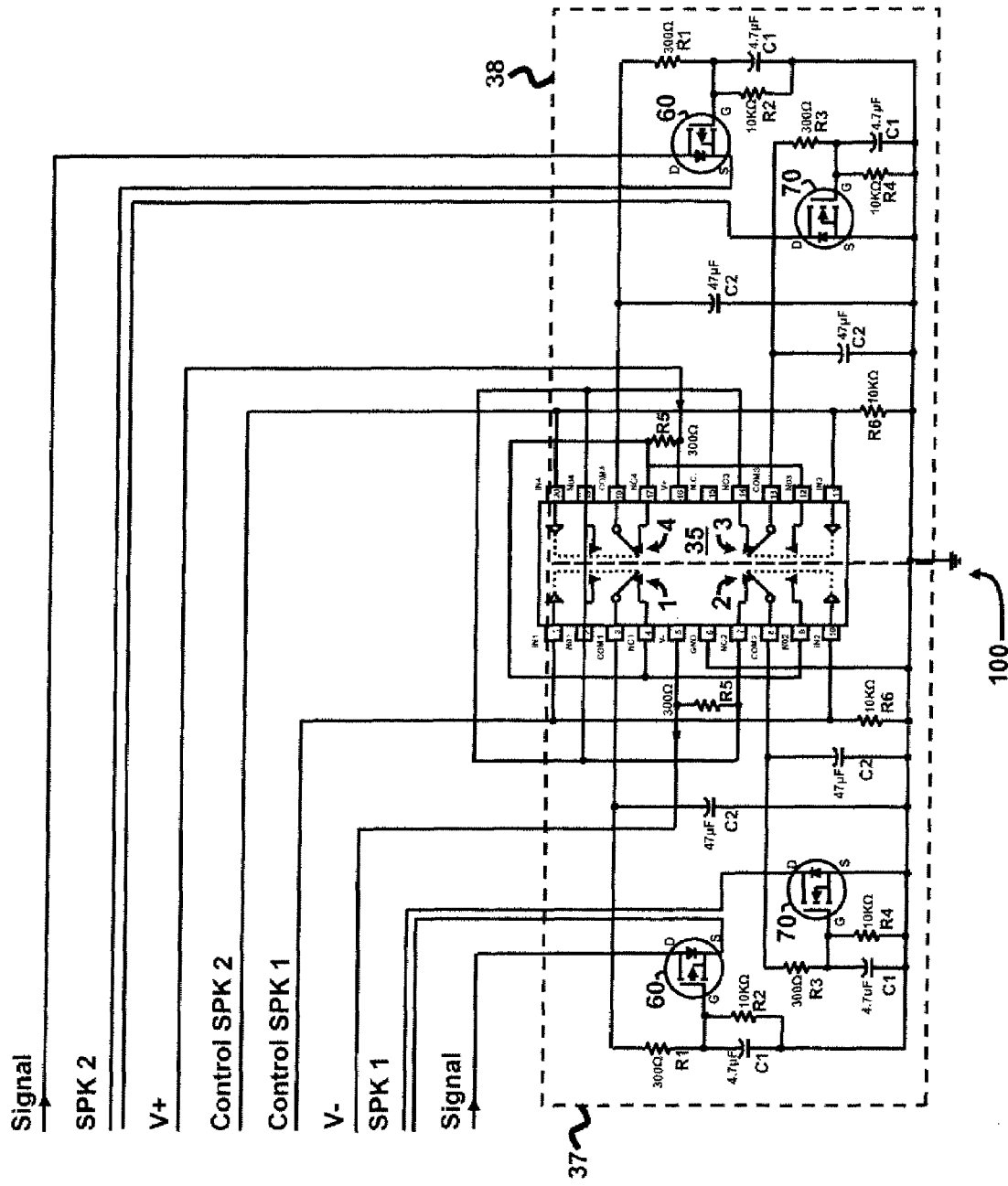
FIG. 2 is a circuit architecture diagram of an amplified signal switching circuit according to an embodiment herein.

As previously mentioned, there is a need for a switching circuit, which includes mitigation capabilities to handle voltage transients that could inadvertently turn a HEXFET on. Furthermore, there is a need for a circuit, which can accommodate high powered and highspeed AC signals. According to a preferred embodiment herein, there is provided a circuit including a unique application of power HEXFETs for switching amplified acoustic or AC signals on or off of without distortion or bleed-through of the amplified signal to other channels. A cluster of these circuits would also have the ability to handle more than one signal with complete isolation. In one embodiment, the circuit is capable of switching an amplified acoustic signal to one of a plurality of different speakers without bleed-through to any of the other speakers. Referring now to the drawings, and more particularly to FIGS. 1 through 3, where similar reference characters denote corresponding features consistently throughout the figures, there are shown preferred embodiments.

FIG. 1 shows a block diagram of a system 10 comprising a plurality of transducers 20 and a switching circuit 100 operable for diverting amplified transient signals to selected transducers 20a (shown as a non-dotted block 20a) and preventing the amplified transient signals from being sent to non-selected transducers 20b (shown as a dotted block 20b), wherein the amplified transient signals are AC or acoustic signals, wherein the plurality of transducers 20 are preferably embodied as a plurality of speakers, and wherein the plurality of transducers 20 are isolated from one another.

The switching circuit 100 may be one of a plurality of switching circuits 100 arranged on an integrated circuit chip 30. The system 10 further comprises an amplifier 40 operable for sending the amplified transient signals to the integrated circuit 30 and a voltage input unit 50 operable for sending voltage to the integrated circuit 30. The switching circuit 100 selectively turns the amplified transient signals on and off to the selected transducers 20a in order to prevent the non-selected transducers 20b from receiving the amplified transient signals. Moreover, the switching circuit 100 minimizes signal distortion in the selected transducers 20a, and alternatively, the switching circuit 100 eliminates signal output to the non-selected transducers 20b.

FIG. 2 further illustrates the switching circuit 100 embodied as a switch circuit according to an embodiment of the invention. The switching circuit 100 comprises a p-channel HEXFET 60, a n-channel HEXFET 70, and a CMOS SPDT (complementary metal oxide semiconductor single-pole dual-throw) analog switch 35. For ease of understanding, the following designations are used: "S" for source, "D" for drain, and "G" for gate for each of the corresponding p-channel HEXFETs 60 and n-channel HEXFETs 70. Preferably, the SPDT analog switch 35 is a "make-before-break" switch, wherein a new contact is made before an old contact is broken thereby ensuring that a moving contact never experiences an open circuit.

While FIG. 2 provides numeric values for different elements (such as the resistors R1-R5 and capacitors C1 and C2), these values are provided as an example and should not be construed as a limitation on the embodiments herein. Preferably, the p-channel HEXFET 60 is rated at −100 volts and is configured to handle 23 amps of current and is used to gate an electrical signal to a speaker SPK1. Preferably, the n-channel HEXFET 70 is rated at +55 volts and is configured to handle 47 amps of current and is used to gate a speaker SPK2 to ground. An example of a SPDT analog switch 35 that may be used in accordance with the embodiments herein is a MAXIM max333AEPP, available from Maxim Integrated Products, California, USA, which operates with a dual power supply and is powered by +7 volts (V+) and −7 volts (V−). The turn-on and turn-off voltages on the respective gates (G) of the HEXFETS 60, 70 are set at the same levels as the dual supplies (±7 volts). Preferably, the HEXFETs 60, 70 are configured in series, where the source (S) of the p-channel HEXFET 60 is connected in series to the drain (D) of the n-channel HEXFET 70 to handle the AC signal components of positive and negative voltages.

According to a preferred embodiment, one SPDT analog switch 35 is used to control a switching circuit 100 comprising two switching components 37, 38, which in turn, control two separate speakers SPK1, SPK2. The NC1 (Normally closed) pin (pin 4 in FIG. 2) on the SPDT analog switch 35 is pulled up to V+ through resistor R5 and supplies p-channel HEXFET 60 with positive voltage which turns off the p-channel HEXFET 60. This protects against the p-channel HEXFET 60 inadvertently turning on if the gate-to-source voltage ($V_{GS}$) exceeds the turn on voltage for the p-channel HEXFET 60. For example, if the AC signal sweeps to +8 volts on the drain (D) of the p-channel HEXFET 60, the voltage difference between the gate (G) and the drain (D) will be −8 volts which is below the −4 volt $V_{GS}$ (gate turn on voltage) and the p-channel HEXFET 60 will turn on even though a gate voltage was not applied. However, when a +7 volt bias is applied to the gate (G) of the p-channel HEXFET 60 in the previous example, the p-channel HEXFET 60 will not turn on because the apparent voltage between the gate (G) and the drain (D) will be −1 volt, which is less than the minimum $V_{GS}$ threshold of −2 volts. If the voltage on the drain (D) of the p-channel HEXFET 60 swings negative, the voltage difference between the gate (G) and the drain (D) will always be positive and the p-channel HEXFET 60 will not turn on.

In other words, experimentally, +7 and −7 volts were used for these signals. The normal closed position of the integrated circuit 30 (at 0 volts) routes the hard turn-off voltages to the gates (G) of the HEXFETs 60, 70, respectively. Furthermore, the HEXFETs 60, 70 remain turned off so long as the gate voltages with respect to the drain voltages remain above or below the turn-on voltage depending on the channel type of the particular HEXFET 60, 70. For example, an AC signal, with a sufficiently large amplitude can turn on the p-channel HEXFET 60 if the signal transcends the required turn-on voltage at the gate (G) of the p-channel HEXFET 60. The amplitude of this signal is the opposite sense needed to turn-on the n-channel HEXFET 70 so the potential voltage across the speaker SPK1, SPK2 is 0 volts.

The n-channel HEXFET 70 is used to block the voltages from the p-channel HEXFET 60 that exceed +11 volts (voltage difference between the gate (G) and the drain (D) of p-channel HEXFET 60 is less than −4 volts and will turn on the p-channel HEXFET 60). The $V_{GS}$ for the n-channel HEXFET 70 is +4 volts and the voltage difference between the gate (G) and the drain (D) of the n-channel HEXFET 70 for a +11 volt signal from the source (S) of the p-channel HEXFET 60 is −11 volts. This voltage level is below the threshold for turning on the gate (G) of the n-channel HEXFET 70. Accordingly, this also mitigates any ground line transients that may couple back into the speaker SPK1, SPK2.

During operation, an amplified AC or acoustic signal is applied to the drain (D) of the p-channel HEXFET 60. The source (S) of the p-channel HEXFET 60 is tied directly through speaker SPK1 to the drain (D) of the n-channel HEXFET 70. The source (S) of the n-channel HEXFET 70 is tied to ground. In the off state both the p-channel and n-channel HEXFETs 60, 70, respectively, have the opposite of their turn-on voltages applied to their respective gates (G) to insure a hard turn-off which negates the effects of any signal bleeding-through due to relative transitions of the AC signal. The integrated circuit 30 then switches the outputs COM1, COM2 (pins 3, 8 in FIG. 2) between two reference voltages.

More specifically, since both HEXFETs 60, 70 cannot be inadvertently turned on at the same time, the HEXFETs 60, 70 completely isolate the AC signals from the respective speaker SPK1, SPK2 until controlled gate voltage is applied to both HEXFETs 60, 70. The gate voltage is supplied from the SPDT analog switch 35 COM1 and COM2 pins. A +5 volt control input signal (ex. supplied by a computer's parallel port (not shown))) is applied to pins IN1, IN2 (labeled as pins 1, 10, respectively in FIG. 2) of the SPDT analog switch 35. The two pins IN1, IN2 are tied together and act to control the voltages that are applied to the respective gates (G) of the HEXFETs 60, 70, respectively. Resistor R6 is used to pull down the control signal to GND to insure the control inputs are at 0 volts when no signal is present on the control line 33 (of FIG. 1). IN1 and IN2 are tied together so both COM1 and COM2 pins are activated simultaneously. Activation of the IN1 and IN2 line on the SPDT analog switch 35 with a +5 volt signal allows the NO1 and NO2 (normally open) pins to be connected to COM1 and COM2 which in turn supplies the appropriate signed voltages to the respective gates (G) of the p-channel HEXFET 60 and the n-channel HEXFET 70 to turn them on. Furthermore, 0 volts applied to IN1 and IN2 causes pins NC1 and NC2 to be connected to COM1 and COM2 and accordingly the HEXFETs 60, 70 are turned off. When the HEXFETs 60, 70 are turned off, the speakers SPK1, SPK2 are completely isolated from the signal and ground. When the HEXFETs 60, 70 are turned on, they have a low resistance to the signal which maximizes the speaker SPK1, SPK2 response and eliminates any distortion of the AC signal. Resistors R1 and R3, which in one embodiment, are 300 ohm resistors and are used to limit the current supplied to the p-channel HEXFET 60 and the n-channel HEXFET 70 by the SPDT analog switch 35 to 23 ma. This is a safety factor that prevents excessive current damage to the SPDT analog switch 35 due to gate failure of the HEXFETs 60, 70.

In other words, with a +5 volt signal, the outputs of the integrated circuit 30 are connected to the turn-on voltages for the respective HEXFETs 60, 70. These output voltages are then applied to the respective gates (G) of the HEXFETs 60, 70, thereby turning them on. This allows the AC signal to pass through the speaker SPK1, SPK2 to ground, which completes the circuit 100. The speaker SPK1, SPK2 then converts the amplified AC signal to an acoustic signal.

As shown in FIG. 2, the analog switch 35 includes four switches 1, 2, 3, 4. Switch 1 and switch 2 control a first output device such as the first speaker (SPK1) and switch 3 and switch 4 control a second output device such as the second speaker (SPK2). Switch 1 is used to turn on/off the first output device such as the first speaker (SPK1) (i.e., control the current flow). Switch 2 is used to control the current flow from the first output device such as the first speaker (SPK1) to ground. Switch 4 is used to turn on/off the second output device such as the second speaker (SPK2) (i.e., control the current flow to the second output device). Switch 3 is used to control the current flow from the second output device such as the second speaker (SPK2) to ground.

As further illustrated in FIG. 2, the IN3 pin (pin 11) serves as a control input for controlling the opening and closing of switch 3 for the current flow from the second output device such as the second speaker (SPK2). The NO3 pin (pin 12) serves as the input to the side of switch 3 that is open when the switch 3 is not engaged (i.e., when the IN3 pin 11 receives a signal, the NO3 pin (pin 12) is connected to the COM3 pin (pin 13), thereby turning on the HEXFETS 60, 70). The COM3 pin (pin 13) serves as the output from switch 3 to the HEXFET 70 which controls the current from the second speaker (SPK2). The NC3 pin (pin 14) serves as the input to the side of switch 3 which is normally closed when the switch 3 is not engaged (i.e., when the IN3 pin (pin 11) does not have a signal, the NC3 pin (pin 14) is connected to the COM3 pin (pin 13), thereby turning off the HEXFETS 60, 70).

The N.C. (not connected) pin (pin 15) is an extra unused pin in a current embodiment. The NC4 pin (pin 17) serves as the input to the side of switch 4 which is normally closed when the switch 4 is not engaged (i.e., when the IN4 pin (pin 20) does not have a signal, the NC4 pin (pin 17) is connected to the COM3 pin (pin 13), thereby turning off the HEXFETS 60, 70). The COM4 pin (pin 18) serves as the output from switch 4 to the HEXFET 60 which controls the current to the second output device such as the second speaker (SPK2). The NO4 pin (pin 19) serves as the input to the side of switch 4 that is open when the switch 4 is not engaged (i.e., when the IN4 pin (pin 20) receives a signal, the NO4 pin (pin 19) is connected to the COM4 pin (pin 18), thereby turning on the HEXFETS 60, 70). The IN4 pin (pin 20) serves as the control input for controlling the opening and closing of switch 4 for the current flow to the second output device such as the second speaker (SPK2).

The time constant for the p-channel HEXFET 60 and the n-channel HEXFET 70 is determined by the values of Capacitor 1 and Resistor 4 (C1, R4) and Capacitor 2 and Resistor 5 (C2, R5). In one embodiment, C1 is approximately 4.7 µF, R4 is approximately 10 kΩ, C2 is approximately 47 µF, and R5 is approximately 300Ω. Preferably, the time constant of the circuit 100 is approximately 0.047 seconds which eliminates any transients caused by circuit activation. The transient signal is sent through Control SPK 1 to the IN1 and IN2 pins of the SPDT analog switch 35, thereby activating the SPDT analog switch 35, which then applies a voltage to the gates (G) of the p-channel and n-channel HEXFETs 60, 70, respectively wherein the p-channel HEXFET 60 is preferably embodied as a P-N-P configuration, while the n-channel HEXFET 70 is preferably embodied as a N-P-N configuration. Resistors R1 and R3 limit the amount of current applied to the gates (G) of the HEXFETs 60, 70 and also serve as a filter in series with capacitors C1 and C2 to eliminate popping of the speaker SPK1, SPK2 when the HEXFETs 60, 70 are activated. Resistors R2 and R4 bleed the current off when the SPDT analog switch 35 is deactivated. Resistor R5 limits current to the negative latches of the SPDT analog switch 35 for pins NO1 and NO2. Resistor R6 limits the current from the SPDT analog switch 35 and provides a path for excess current when pins IN1 and IN2 are de-activated. When the signal is sent to activate the circuit, pins NO1 and NO2 (pins 2 and 9, respectively in FIG. 2) supply the correct voltages to the gates (G) of the HEXFETs 60, 70, which in turn activate the speaker SPK1, SPK2.

The following is an example demonstrating the functionality of the system 10. The system 10 initially begins in the off state (0 volts), which causes the SPDT analog switch 35 to switch on the normally closed output voltages to the HEXFETs 60, 70. Each of the gates (G) of the HEXFETs 60, 70 receive its respective hard turn-off voltage of −7 volts or +7 volts, for example. If an amplified acoustic signal with average amplitude of approximately 30 volts peak to peak is placed on the signal line (the drain (D) of the p-channel HEXFET 60), then a 0 to −16 volt signal would be seen on the drain (D) of the n-channel HEXFET 70. This is due to the p-channel HEXFET 60 turning on when the relative voltage exceeds +7 volts. This happens when the input signal transitions to less than −14 volts (the output goes from 0 to −14 volts when the input goes from −14 volts to −30 volts). The n-channel HEXFET 70 does not turn on because it sees a +7 volt to +21 volt relative the gate-drain voltage and the n-channel HEXFET 70 requires a −7 volt relative gate-drain voltage to turn on. Therefore, a non-selected speaker (either SPK1 or SPK2) does not transmit an acoustic signal.

In another embodiment illustrated in FIG. 3 (with reference to FIGS. 1 and 2), the embodiments herein provide a method of diverting amplified transient signals comprising arranging (300) a plurality of transducers 20 in isolation from one another; generating (310) amplified transient signals; diverting (320) the amplified transient signals to selected transducers 20a using a switching circuit 100; and preventing (330) the amplified transient signals from being sent to non-selected transducers 20b, wherein the amplified transient signals are AC or acoustic signals, and wherein the plurality of transducers 20 comprise a plurality of speakers SPK1, SPK2. The method further comprises selectively turning (340) the amplified transient signals on and off to the selected transducers 20a in order to prevent the non-selected transducers 20b from receiving the amplified transient signals. Moreover, the method further comprises minimizing (350) signal distortion in the selected transducers 20a, or alternatively eliminating (355) signal output to the non-selected transducers 20b.

Preferably, the switching circuit 100 is computer controlled with the signal being moved around an array of speakers SPK1, SPK2 in a rapid sequence. While only two speakers SPK1, SPK2 are shown in FIG. 2, the circuit 100 may be incorporated into a system 10 comprising well over thirty speakers. The switching circuit 100 is capable of handling voltages in excess of ±60 volts with complete isolation of the signal and no bleed through detected at the speaker SPK1, SPK2. The switching circuit 100 also has a turn on time of less than 50 ms with no audible popping noise when energized. During implementation, the maximum frequency response may be measured to be greater that approximately 100 MHz, and which is dependent on the internal capacitance of the HEXFETs 60, 70.

An advantage of the system 10 is that one can amplify the signal before being switched to a particular transducer 20. This means only one amplifier 40 is needed for all of the transducers 20 as opposed to amplifying the signal directly to the transducer 20, which in the case of speakers, would require separate amplifiers 40 for each speaker SPK1, SPK2, as in the conventional systems. Also, the system 10 can handle rapidly changing AC signals with complete isolation from adjacent transducers 20. Moreover, the system 10 can easily switch moderately powered AC signals (signals in excess of 10 volts). In fact, experimental tests have been performed on the system 10 with voltages in excess of 100 V on an 8-Ohm load, and the system 10 functioned properly according to the experiment. According to the embodiments, the unique design for switching AC signals can easily handle high frequency signals (50 KHz) with moderately high power (in excess of 500 watts) and complete isolation for adjacent speakers SPK1, SPK2. The design of the system 10 also eliminates the inherent "pop" associated with conventional amplifier turn on. Furthermore, the switching circuit 100 is capable of diverting an amplified transient signal to any one of several transducers 20 thus eliminating the need to adjust for output impedance concerns. The system 10 also completely isolates the transducers 20 from each other thus eliminating cross talk between transducers 20 or concerns associated with AC signals on ground planes.

The embodiments herein are operable in any environment that needs the capability of switching one input signal to one of many outputs. For example, virtuality simulators with a multiple speaker array would benefit from the embodiments herein, as would a public announcement system in a school or office where one would want to select a single room to broadcast to. In fact, the embodiments herein are advantageous in this regard as they would significantly reduce the size of the switchboard typically required for such systems/uses.

Moreover, the system 10 provided by the embodiments herein can accommodate a plurality of different acoustic signals (for example, 8 different signals), wherein each signal is routed to one of a plurality of speakers SPK1, SPK2 with no two signals going to the same speaker SPK1, SPK2 at the same time. The system 10 provided by the embodiments herein may be used in any powered AC application where switching of the signal is required. Moreover, the ability to switch an amplified signal will drastically reduce the number of amplifiers 40 required to perform a specific task. As mentioned, conventionally if a requirement existed to have, for example, twenty-five speakers, then twenty-five amplifiers would be needed to power the speakers because of the lack of a switch capable of handling powered AC signals. However, according to the embodiments herein, only one amplifier 40 is required to amplify the signal, which could then be switched to any one of the plurality of transducers 20 (i.e., speakers SPK1, SPK2).

Generally, the embodiments herein provide a circuit 100 that can switch moderately powered signals. This is accomplished by using HEXFETs 60, 70 in the circuit 100 in a novel manner. Instead of putting the AC signal on the gates (G) of the HEXFETs 60, 70 (as usually done in a motor control circuit), the circuit 100 uses a DC signal on the gate (G) of the HEXFETs 60, 70, and the drain (D) of the HEXFETs 60, 70 receives the AC signal. Accordingly, the embodiments of the invention use a pair of complementary HEXFETs 60, 70 to protect the circuit 100, when it is turned off, from AC swings in one polarity or the other.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A high powered high speed acoustic signal switching system comprising:

a plurality of isolated speakers, wherein said plurality of isolated speakers are isolated from one another;

an amplifier operable for generating acoustic signals;

a switch operable for diverting acoustic signals to selected isolated speakers and preventing said acoustic signals from being sent to non-selected isolated speakers while eliminating signal distortion in the non-selected isolated speakers ; and a hexagonal cell field effect transistor connected to said switch.

2. The high powered high speed acoustic signal switching system of claim 1, wherein said hexagonal cell field effect transistor further comprises:

an n-channel hexagonal cell field effect transistor comprising an n-channel source, an n-channel drain, and an n-channel gate component;

a p-channel hexagonal cell field effect transistor comprising a p-channel source, a p-channel drain, and a p-channel gate component; and a voltage input unit operable to send voltage to said n-channel gate component and said p-channel gate component.

3. A method of diverting acoustic signals, said method comprising:

arranging a plurality of isolated speakers in isolation from one another;

generating acoustic signals;

diverting said acoustic signals to selected isolated speakers using a switching circuit;

preventing said acoustic signals from being sent to non-selected isolated speakers selectively turning said acoustic signals on and off to said isolated speakers in order to prevent said non-selected isolated speakers from receiving said acoustic signals; and eliminating signal distortion in said non-selected isolated speakers.

* * * * *